(12) United States Patent
Ohkubo et al.

(10) Patent No.: US 11,462,439 B2
(45) Date of Patent: Oct. 4, 2022

(54) WAFER PROCESSING METHOD

(71) Applicant: DISCO CORPORATION, Tokyo (JP)

(72) Inventors: Hironari Ohkubo, Tokyo (JP); Keita Obara, Tokyo (JP); Shinya Honda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 100 days.

(21) Appl. No.: 17/064,187

(22) Filed: Oct. 6, 2020

(65) Prior Publication Data

US 2021/0111075 A1  Apr. 15, 2021

(30) Foreign Application Priority Data

Oct. 10, 2019  (JP) .............. JP2019-186932

(51) Int. Cl.
| | |
|---|---|
| *H01L 21/268* | (2006.01) |
| *H01L 21/66* | (2006.01) |
| *H01L 21/683* | (2006.01) |
| *H01L 23/544* | (2006.01) |
| *H01L 21/78* | (2006.01) |
| *G06T 7/73* | (2017.01) |
| *G06T 7/00* | (2017.01) |

(52) U.S. Cl.
CPC ............. *H01L 21/78* (2013.01); *G06T 7/001* (2013.01); *G06T 7/74* (2017.01); *H01L 21/268* (2013.01); *H01L 22/20* (2013.01); *H01L 23/544* (2013.01); *G06T 2207/30148* (2013.01); *H01L 2223/5446* (2013.01)

(58) Field of Classification Search
CPC ............... H01L 21/67092; H01L 21/78; H01L 21/6836; H01L 23/544
See application file for complete search history.

(56) References Cited

U.S. PATENT DOCUMENTS

| | | | | |
|---|---|---|---|---|
| 6,422,227 | B1* | 7/2002 | Kobayashi | B28D 5/0058 125/14 |
| 2004/0185580 | A1* | 9/2004 | Goh | H01L 21/67092 438/460 |
| 2017/0186656 | A1* | 6/2017 | Iwamoto | H01L 21/681 |
| 2020/0402918 | A1* | 12/2020 | Kamphuis | H01L 21/78 |

FOREIGN PATENT DOCUMENTS

| | | |
|---|---|---|
| JP | 2005197492 A | 7/2005 |
| JP | 2016104491 A | 6/2016 |
| JP | 2017117924 A | 6/2017 |
| WO | WO-2020008838 A1 * | 1/2020 |

* cited by examiner

*Primary Examiner* — Brian Turner
(74) *Attorney, Agent, or Firm* — Greer Burns & Crain, Ltd.

(57) ABSTRACT

A wafer processing method includes a pattern region detecting step, an evaluation region setting step, and an evaluation region deploying step. The pattern region detecting step is a step of detecting a period and positional information in which a substantially identical image appears in an imaged image and detecting a pattern region corresponding to one period. The evaluation region setting step is a step of detecting a position in which no metallic pattern is formed on planned dividing lines and setting the position as an evaluation region for evaluating quality of a processed groove. The evaluation region deploying step is a step of recording the position of the evaluation region in the pattern region and deploying the evaluation region at similar positions in different pattern regions.

4 Claims, 12 Drawing Sheets

WAFER PROCESSING METHOD

BACKGROUND OF THE INVENTION

Field of the Invention

The present invention relates to a wafer processing method.

Description of the Related Art

A cutting apparatus using a cutting blade or a laser processing apparatus using a laser is used to divide, into individual chips, a wafer such as a semiconductor wafer or an optical device wafer in a disk shape in which silicon, sapphire, silicon carbide, gallium arsenide, or the like is used as a base material. These apparatuses use a function of what is generally called a kerf check, which automatically checks during processing whether a processing trace (a cut groove or a laser processing trace) is included within a planned dividing line and whether or not a large chipping or the like has occurred (see Japanese Patent Laid-Open No. 2005-197492). In addition, a laser processing apparatus uses a function of what is generally called kerf navigation, which images emitted light generated by laser irradiation during processing and determines the quality of processing conditions (see Japanese Patent Laid-Open No. 2016-104491).

SUMMARY OF THE INVENTION

However, conventionally, the kerf check may not be able to be performed correctly in a region in which a test element group (TEG) is formed (see Japanese Patent Laid-Open No. 2017-117924). In addition, the kerf navigation may not be able to be performed correctly either in a region in which a TEG is formed because the emitted light resulting from the laser irradiation is not generated normally in the region.

Therefore, there occurred work in which an operator finds a position in which there is no TEG while moving the position of a microscope imaging the wafer before processing and makes registration in the apparatus to perform a kerf check or kerf navigation at the position (see Japanese Patent Laid-Open No. 2017-117924). This registration work is troublesome, and an error of the operator may be induced because a position in which there is no TEG is determined visually.

It is accordingly an object of the present invention to provide a wafer processing method that can reduce the trouble of the work of registering a position in which there is no TEG to perform a kerf check or kerf navigation.

In accordance with an aspect of the present invention, there is provided a method of processing a wafer having a plurality of identical pattern regions periodically formed on a top surface, the identical pattern regions each including a plurality of planned dividing lines intersecting each other and device regions demarcated by the plurality of planned dividing lines, the method including a holding step of holding an undersurface side of the wafer on a holding table; an imaging step of imaging a plurality of positions on the top surface of the wafer while moving the holding table and an imaging unit relative to each other; a pattern region detecting step of detecting a period and positional information in which a substantially identical image appears in an imaged image and detecting a pattern region corresponding to one period; an evaluation region setting step of detecting a position in which no metallic pattern is formed on the planned dividing lines and setting the position as an evaluation region for evaluating quality of a processed groove; an evaluation region deploying step of recording a position of the evaluation region in the pattern region and deploying the evaluation region at similar positions in different pattern regions; a processing step of processing the wafer; and a processed groove evaluating step of imaging processed grooves by imaging the evaluation region in at least two or more of the pattern regions, and determining the quality of the processed grooves.

In accordance with another aspect of the present invention, there is provided a method of processing a wafer having a plurality of identical pattern regions periodically formed on a top surface, the identical pattern regions each including a plurality of planned dividing lines intersecting each other and device regions demarcated by the plurality of planned dividing lines, the method including a holding step of holding an undersurface side of the wafer on a holding table; an imaging step of imaging a plurality of positions on the top surface of the wafer while moving the holding table and an imaging unit relative to each other; a pattern region detecting step of detecting a period and positional information in which a substantially identical image appears in an imaged image and detecting a pattern region corresponding to one period; an evaluation region setting step of detecting a position in which no metallic pattern is formed on the planned dividing lines and setting the position as an evaluation region for evaluating quality of a processed groove; an evaluation region deploying step of recording a position of the evaluation region in the pattern region and deploying the evaluation region at similar positions in different pattern regions; a processing step of processing the wafer by irradiating the wafer with a laser beam; and a processed groove evaluating step of imaging the evaluation region and emitted light generated by application of the laser beam during processing of the evaluation region and determining quality of processing conditions.

Preferably, the plurality of planned dividing lines are formed in a first direction and a second direction intersecting the first direction, and the pattern region detecting step is performed in both the first direction and the second direction.

The invention of the present application can reduce the trouble of the work of registering a position in which there is no TEG to perform a kerf check or kerf navigation.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described in detail with reference to the drawings. The present invention is not limited by contents described in the following embodiments. In addition, constituent elements described in the following include constituent elements readily conceivable by those skilled in the art and essentially identical constituent elements. Further, configurations described in the following can be combined with each other as appropriate. In addition, various omissions, replacements, or modifications of configurations can be performed without departing from the spirit of the present invention.

First Embodiment

Figure 1:
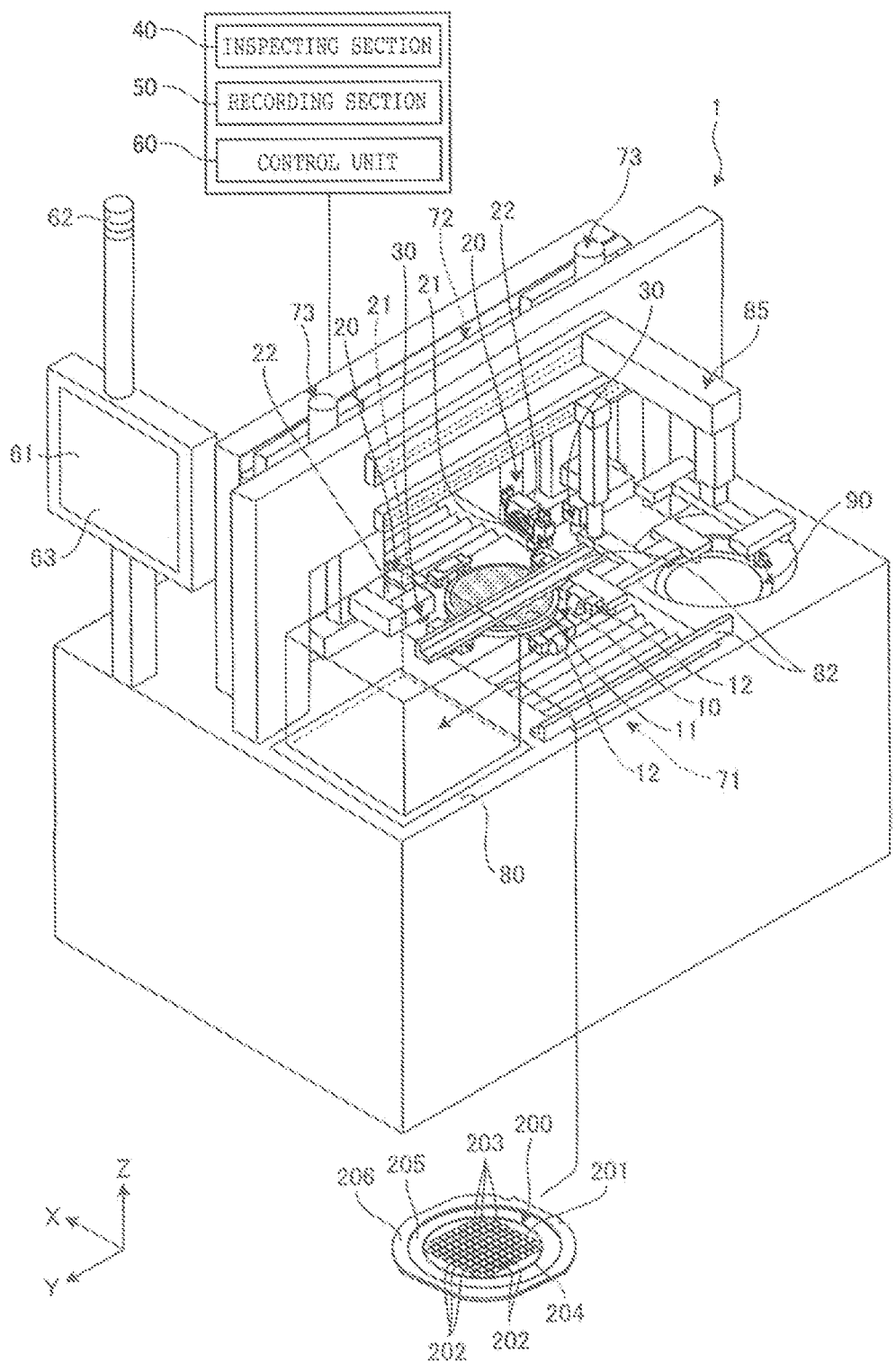
FIG. 1 is a perspective view illustrating an example of a configuration of a processing apparatus that performs a wafer processing method according to a first embodiment.

A processing apparatus 1 that performs a wafer processing method according to a first embodiment of the present invention will be described with reference to drawings. FIG. 1 is a perspective view illustrating an example of a configuration of the processing apparatus 1 that performs the wafer processing method according to the first embodiment. The processing apparatus 1 is a cutting apparatus that cuts a wafer 200 as a workpiece, and carries out what is generally called a kerf check on a cut groove 400 (see FIG. 11 and FIG. 12) as a processing trace (processed groove) formed by the cutting processing. In the following, description will be made of a mode of carrying out the cutting processing and a kerf check on a cut groove 400 formed by the cutting processing. Incidentally, the processing apparatus 1 in the present invention is not limited to this and may be a laser processing apparatus that laser-processes the wafer 200 by irradiating the wafer 200 with a laser and carries out what is generally called a kerf check on a laser processing trace as a processing trace (processed groove) formed by the laser processing.

In the first embodiment, as depicted in FIG. 1, the wafer 200 to be cut by the processing apparatus 1 is, for example, a semiconductor wafer, an optical device wafer, or the like in a disk shape in which silicon, sapphire, silicon carbide (SiC), gallium arsenide, or the like is used as a base material. Incidentally, the wafer 200 in the present invention is not limited to this and may be a package substrate having devices 203 sealed by a resin, a ceramic plate, a glass plate, or the like. An adhesive tape 205 is affixed to an undersurface 204 on an underside of a flat surface 201 of the wafer 200. An annular frame 206 is fitted to an outer edge portion of the adhesive tape 205.

The wafer 200 has, on the surface 201, devices 203 formed in regions demarcated by a plurality of planned dividing lines 202 formed along each of a first direction and a second direction, the second direction forming intersection portions 207 (see FIG. 3 and the like) by intersecting the first direction. The wafer 200 in the first embodiment is formed in a lattice manner such that the first direction and the second direction in which the plurality of planned dividing lines 202 are formed on the surface 201 are orthogonal to each other. However, the wafer 200 in the present invention is not limited to this. TEGs as an example of metallic patterns 208 (see FIG. 3 and the like) constituted by a metal are formed in the planned dividing lines 202. Dummy patterns for chemical mechanical polishing (CMP) may also be formed in the planned dividing lines 202.

The wafer 200 in the first embodiment has a plurality of identical pattern regions periodically formed on the surface 201 by a reticle, which is a mask pattern serving as a master of circuit patterns. Specifically, the wafer 200 has, on the surface 201, pattern regions periodically formed in the first direction and in the second direction in which pattern regions the TEGs formed in the planned dividing lines 202, the dummy patterns for CMP, the devices 203, and the like are identical. The wafer 200 in the present invention is not limited to this. The wafer 200 may be in any form as long as a plurality of identical pattern regions including the planned dividing lines 202 and the devices 203 demarcated by the planned dividing lines 202 are periodically formed on the surface 201 in either a case where the identical pattern regions are formed by a reticle or a case where the identical pattern regions are formed by a form different from a reticle.

As depicted in FIG. 1, the processing apparatus 1 includes a holding table 10, processing units 20 for performing cutting processing, imaging units 30, an inspecting section 40, a recording section 50, and a control unit 60. As depicted in FIG. 1, the processing apparatus 1 is what is generally called a facing dual type cutting apparatus having two processing units 20, that is, a twin spindle dicing saw.

In addition, as depicted in FIG. 1, the processing apparatus 1 further includes an X-axis moving unit 71, a Y-axis moving unit 72, and Z-axis moving units 73. The X-axis moving unit 71 processing-feeds the holding table 10 relative to the processing units 20 along an X-axis direction as one direction of a horizontal direction. The Y-axis moving unit 72 indexing-feeds the processing units 20 relative to the holding table 10 along a Y-axis direction that is another direction of the horizontal direction and is orthogonal to the X-axis direction. The Z-axis moving units 73 cutting-feed the processing units 20 relative to the holding table 10 along a Z-axis direction that is orthogonal to both the X-axis direction and the Y-axis direction and is parallel with a vertical direction.

The holding table 10 holds the undersurface 204 side of the wafer 200 having the plurality of planned dividing lines 202. The holding table 10 is of a disk shape including a disk-shaped suction portion formed of a porous ceramic or the like in which suction portion a flat holding surface 11 holding the wafer 200 is formed as an upper surface and which suction portion has a large number of porous holes; and a frame body that fixes the suction portion with the suction portion fitted in a recess portion in a central portion of the upper surface. The holding table 10 is provided so as to be movable by the X-axis moving unit 71 and rotatable by an unillustrated rotation driving source. The suction portion of the holding table 10 is connected to an unillustrated vacuum suction source via an unillustrated vacuum suction path. The holding table 10 sucks and holds the wafer 200 by the whole of the holding surface 11. In addition, as depicted in FIG. 1, a plurality of clamp units 12 that clamp the annular frame 206 are arranged on the periphery of the holding table 10.

The processing units 20 form cut grooves 400 by processing the wafer 200 held on the holding table 10 along the planned dividing lines 202. The processing units 20 include a cutting blade 21, a spindle, and a spindle housing 22. A rotating operation about the Y-axis is applied to the cutting blade 21, and the cutting blade 21 cuts the wafer 200 held on the holding table 10. The spindle is disposed along the Y-axis direction and supports the cutting blade 21 by a front end thereof such that the cutting blade 21 is rotatable about the Y-axis. The spindle housing 22 houses the spindle so as to be capable of performing rotating operation about the Y-axis. In the processing unit 20, the spindle housing 22 is provided so as to be movable in the Y-axis direction by the Y-axis moving unit 72 and movable in the Z-axis direction by the Z-axis moving unit 73 with respect to the wafer 200 held on the holding table 10.

The imaging units 30 photograph the surface 201 of the wafer 200 held on the holding surface 11 of the holding table 10. The imaging units 30 are, for example, an electron microscope. The imaging units 30 include an imaging element that images the planned dividing lines 202 on the wafer 200 yet to be subjected to cutting processing which wafer is held on the holding table 10 and the cut grooves 400 as processing traces of the wafer 200 subjected to the cutting processing. The imaging element is, for example, a charge-coupled device (CCD) imaging element or a complementary metal oxide semiconductor (CMOS) imaging element. The imaging units 30 can be switched to a macroscopic imaging setting of a low magnification (Lo) or a microscopic imaging setting of a high magnification (Hi) to image the surface 201 of the wafer 200. The imaging units 30 in the first embodiment are fixed to the processing units 20 so as to move integrally with the processing units 20.

The imaging units 30 image the wafer 200 yet to be subjected to the cutting processing which wafer is held on the holding table 10, obtain an image, for example, for carrying out alignment that aligns the wafer 200 with the cutting blades 21, and output the obtained image to the control unit 60. In addition, the imaging units 30 image the wafer 200 subjected to the cutting processing which wafer is held on the holding table 10, to thereby obtain an image, for example, for carrying out what is generally called a kerf check that automatically checks whether a cut groove 400 is included within the planned dividing line 202 and whether or not a large chipping or the like has occurred, and output the obtained image to the control unit 60.

The inspecting section 40 is a functional section that detects the cut groove 400 as a processing trace formed by the processing unit 20 from the image obtained by photographing the planned dividing line 202 and inspects the state of the cut groove 400 as a processing trace for predetermined inspection items. Details of the predetermined inspection items inspected by the inspecting section 40 will be described later.

The recording section 50 is a functional section that records the images photographed by the imaging units 30, specifically, the image for carrying out the above-described alignment, for example, and the image for carrying out a kerf check, for example. In addition, the recording section 50 records information regarding pattern regions of planned dividing lines 202, devices 203 or the like and information regarding evaluation regions 210 and 212 (see FIG. 10 and the like) in which a kerf check is carried out.

The control unit 60 controls each of constituent elements of the processing apparatus 1 and thereby makes the processing apparatus 1 perform each operation related to cutting processing and a kerf check on the wafer 200.

The inspecting section 40, the recording section 50, and the control unit 60 in the first embodiment include a computer system. The inspecting section 40, the recording section 50, and the control unit 60 include an arithmetic processing apparatus having a microprocessor such as a central processing unit (CPU), a storage apparatus having a memory such as a read only memory (ROM) or a random access memory (RAM), and an input-output interface apparatus. The arithmetic processing apparatus performs arithmetic processing according to a computer program stored in the storage apparatus and outputs a control signal for controlling the processing apparatus 1 to each constituent element of the processing apparatus 1 via the input-output interface apparatus.

In addition, the arithmetic processing apparatus is connected to a display unit 61 formed by a liquid crystal display apparatus or the like that displays the state of each operation related to cutting processing and a kerf check, an image, or the like, a notifying unit 62 formed by a light emitting diode (LED) or the like that performs notification on the basis of the state of each operation related to the cutting processing and the kerf check, and an input unit 63 used when an operator, for example, inputs and registers information regarding the cutting processing and the kerf check or the like. The input unit 63 is formed by at least one of a touch panel provided in the display unit 61, a keyboard, and the like.

The inspecting section 40 is a functional section implemented by the arithmetic processing apparatus by executing the computer program stored in the storage apparatus. The recording section 50 is implemented by the storage apparatus. The control unit 60 is implemented by the arithmetic processing apparatus, the storage apparatus, and the input-output interface apparatus. While the inspecting section 40, the recording section 50, and the control unit 60 in the first embodiment are implemented on the basis of an integrated computer system, the present invention is not limited to this, and each section and each unit may be implemented on the basis of an independent computer system, for example.

The processing apparatus 1 performs what is generally called a kerf check in which the control unit 60 inspects the state of a cut groove 400 as a processing trace by the inspecting section 40 in any timing between a start of processing of one wafer 200 to an end of the processing.

In addition, as depicted in FIG. 1, the processing apparatus 1 further includes a cassette 80 that houses wafers 200 before and after cutting processing; a temporary placing unit 82 on which a wafer 200 before and after being housed in the cassette 80 is temporarily placed; a cleaning unit 90 that cleans a wafer 200 after the cutting processing; and a transfer unit 85 that transfers the wafer 200 between the holding table 10, the cassette 80, the temporary placing unit 82, and the cleaning unit 90.

In the processing apparatus 1, the transfer unit 85 extracts one wafer 200 from within the cassette 80 and places the wafer 200 on the holding surface 11 of the holding table 10. The processing apparatus 1 moves the holding table 10 and a processing unit 20 relative to each other along the planned dividing lines 202 by the X-axis moving unit 71, the rotation driving source, the Y-axis moving unit 72, and the Z-axis moving units 73 while sucking and holding the wafer 200 by the holding surface 11 of the holding table 10 and supplying cutting water from the processing unit 20 to the wafer 200, and forms a cut groove 400 by cutting a planned dividing line 202 of the wafer 200 by the processing unit 20. After the processing apparatus 1 cuts all of the planned dividing lines 202 of the wafer 200, the processing apparatus 1 cleans the wafer 200 by the cleaning unit 90 and thereafter houses the wafer 200 within the cassette 80.

Figure 2:
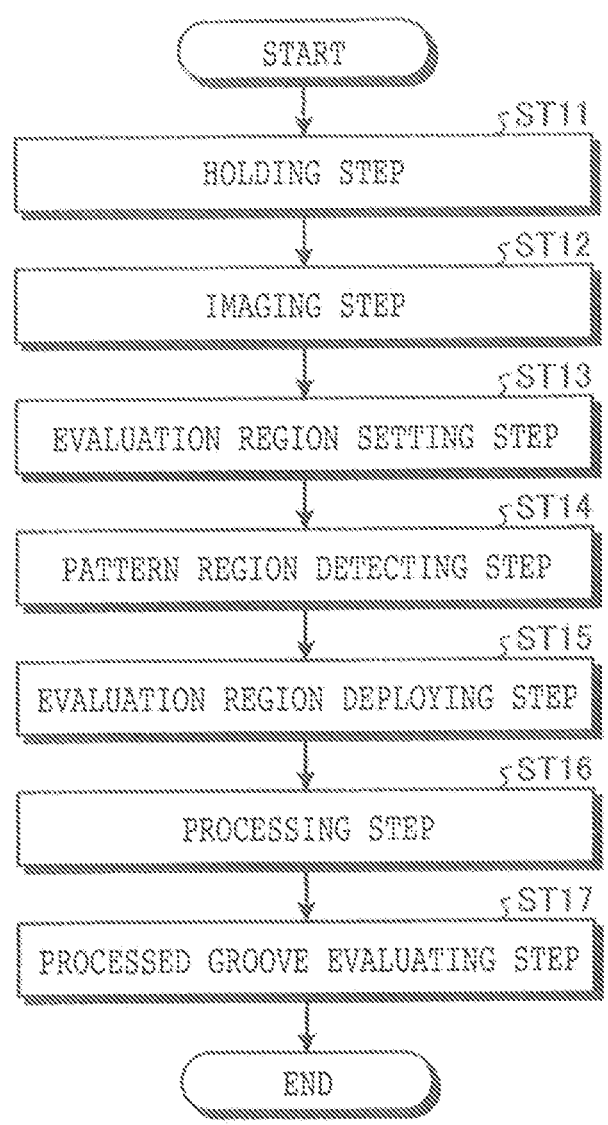
FIG. 2 is a flowchart illustrating an example of a flow of the wafer processing method according to the first embodiment.

FIG. 2 is a flowchart illustrating an example of a flow of the wafer processing method according to the first embodiment. In the following, referring to FIG. 2, description will be made of the wafer processing method according to the first embodiment which method is performed by the processing apparatus 1. As depicted in FIG. 2, the wafer processing method according to the first embodiment includes a holding step ST11, an imaging step ST12, an evaluation region setting step ST13, a pattern region detecting step ST14, an evaluation region deploying step ST15, a processing step ST16, and a processed groove evaluating step ST17.

The holding step ST11 is a step of holding the undersurface 204 side of the wafer 200 on the holding table 10. Specifically, the holding step ST11 holds the wafer 200 in a state in which the surface 201 of the wafer 200 is exposed upward, by sucking and holding the undersurface 204 side of the wafer 200 transferred by the transfer unit 85 and mounted on the holding table 10, by the holding surface 11 of the holding table 10 via the adhesive tape 205.

After the holding step ST11, the control unit 60 carries out alignment that aligns the wafer 200 with the cutting blade 21, by using the imaging unit 30. As a result of this alignment, in the first embodiment, the first direction of the planned dividing lines 202 of the wafer 200 on the holding table 10 is aligned with the X-axis direction of the processing apparatus 1, and the second direction of the planned dividing lines 202 is aligned with the Y-axis direction of the processing apparatus 1. In addition, as a result of this alignment, positional information of the planned dividing lines 202 formed on the wafer 200 on the holding table 10 is recorded as X and Y coordinates in the recording section 50 and is set in a state of being able to be handled as X and Y coordinates in information processing by the control unit 60.

The imaging step ST12 is performed after the holding step ST11. The imaging step ST12 is a step of imaging a plurality of parts of the surface 201 of the wafer 200 while moving the holding table 10 and the imaging unit 30 relative to each other.

In the imaging step ST12, next, the control unit 60 images, by the imaging unit 30, an image of the surface 201 of the wafer 200 yet to be subjected to cutting processing which wafer is held on the holding table 10. At this time, an image in which the surface 201 is divided into a plurality of parts and the positions of all of the planned dividing lines 202 can be identified may be obtained. In the imaging step ST12, the control unit 60 may image, by the imaging unit 30, a macroscopic image in the macroscopic imaging setting of a low magnification, may image a microscopic image in the microscopic imaging setting of a high magnification, or may image both the macroscopic image and the microscopic image.

Figure 3:
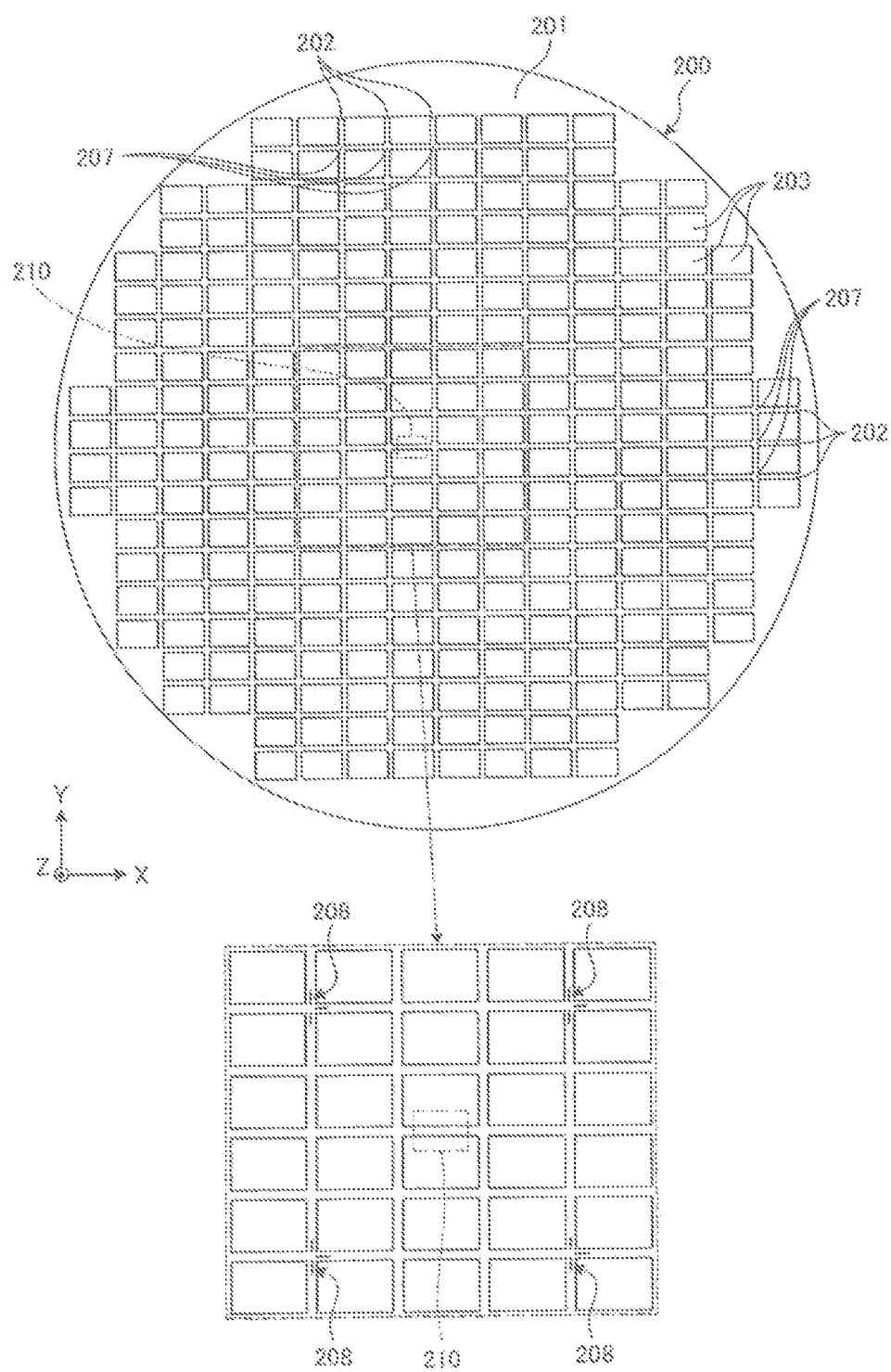
FIG. 3 is a plan view illustrating an example of an imaging step and an evaluation region setting step in the wafer processing method of FIG. 2.

FIG. 3 is a diagram illustrating an example of the imaging step ST12 and the evaluation region setting step ST13 in the wafer processing method of FIG. 2. In the imaging step ST12, in a case where the control unit 60 images a macroscopic image in the macroscopic imaging setting of a low magnification by the imaging unit 30, the entire surface 201 of the wafer 200 may be imaged, and one large image may be synthesized by piecing together imaged images, as depicted in FIG. 3. In the imaging step ST12, as depicted in FIG. 3, the control unit 60 may display the whole image of the surface 201 of the wafer 200 and an enlarged image of a part of the surface 201 of the wafer 200 on the display unit 61. In the imaging step ST12, the control unit 60 records the image imaged by the imaging unit 30 in the recording section 50.

The evaluation region setting step ST13 is performed after the alignment and the imaging step ST12. The evaluation region setting step ST13 is a step of detecting a position and a region in which a metallic pattern 208 such as a TEG is not formed on planned dividing lines 202 and setting a part of the region in which no metallic pattern 208 is formed as an evaluation region 210 for evaluating the quality of a cut groove 400 as a processed groove.

In the evaluation region setting step ST13, specifically, the control unit 60 first detects a position and a region in which a metallic pattern 208 such as a TEG is formed on planned dividing lines 202, on the basis of the image obtained in the imaging step ST12. Thus, in the evaluation region setting step ST13, the control unit 60 can identify a position and a region in which a metallic pattern 208 such as a TEG is not formed on planned dividing lines 202.

In the evaluation region setting step ST13, the control unit 60 may further display, on the display unit 61, an image of metallic patterns 208 in a form of being superimposed on the whole image of the surface 201 of the wafer 200 and the enlarged image of the part of the surface 201 of the wafer 200. Consequently, in the evaluation region setting step ST13, the operator can visually identify a position and a region in which no metallic pattern 208 is formed, on the basis of the whole image of the surface 201 of the wafer 200 and the enlarged image of the part of the surface 201 of the wafer 200, the images being displayed on the display unit 61.

In the evaluation region setting step ST13, next, the operator selects a region in which the quality of a cut groove 400 is intended to be evaluated after formation of the cut groove 400, from the region in which no metallic pattern 208 is displayed while viewing the whole image of the surface 201 of the wafer 200 and the enlarged image of the part of the surface 201 of the wafer 200, the images being displayed on the display unit 61. The operator then inputs the region in which the quality of the cut groove 400 is intended to be evaluated via the input unit 63. In response to this, in the evaluation region setting step ST13, the control unit 60 recognizes and sets a region corresponding to the selected and input region as the evaluation region 210. Incidentally, when the operator selects and inputs a region in which a metallic pattern 208 is displayed, the control unit 60 displays a response display indicating to the effect that a region corresponding to the selected and input region cannot be set as the evaluation region 210 on the display unit 61 without setting the evaluation region 210, and requests input of a region to be set as the evaluation region 210 again. In addition, while only an evaluation region 210 in one part is set in the evaluation region setting step ST13 in the first embodiment, the present invention is not limited to this, and evaluation regions 210 in two or more parts may be set. In addition, in the evaluation region setting step ST13, the operator may check an imaged image while moving an imaged region and search for and set a region in which no metallic pattern 208 is formed.

The pattern region detecting step ST14 is performed at least after the alignment and the imaging step ST12. The pattern region detecting step ST14 is a step in which the control unit 60 detects a period and positional information in which a substantially identical image appears in the imaged image and detects one pattern region. Incidentally, while one detected pattern region corresponds to one reticle in the pattern region detecting step ST14 in the first embodiment, the present invention is not limited to this, and one detected pattern region may correspond to one of a plurality of pattern regions periodically formed irrespective of the reticle.

In the first embodiment, the control unit 60 performs the pattern region detecting step ST14 in both the X-axis direction corresponding to the first direction of the planned dividing lines 202 and the Y-axis direction corresponding to the second direction of the planned dividing lines 202, combines those results with each other, and detects the period and positional information of the pattern region in a planar direction (XY plane direction) on the basis of a period and positional information in the first direction (X-axis direction) and a period and positional information in the second direction (Y-axis direction). Incidentally, in the following, the pattern region detecting step ST14 for the X-axis direction corresponding to the first direction and the pattern region detecting step ST14 for the Y-axis direction corresponding to the second direction are similar to each other except for the directions in which the pattern region detecting step ST14 is performed. Thus, detailed description will be made of only the pattern region detecting step ST14 performed for the X-axis direction corresponding to the first direction, and detailed description of the pattern region detecting step ST14 performed for the Y-axis direction corresponding to the second direction will be omitted.

Figure 4:
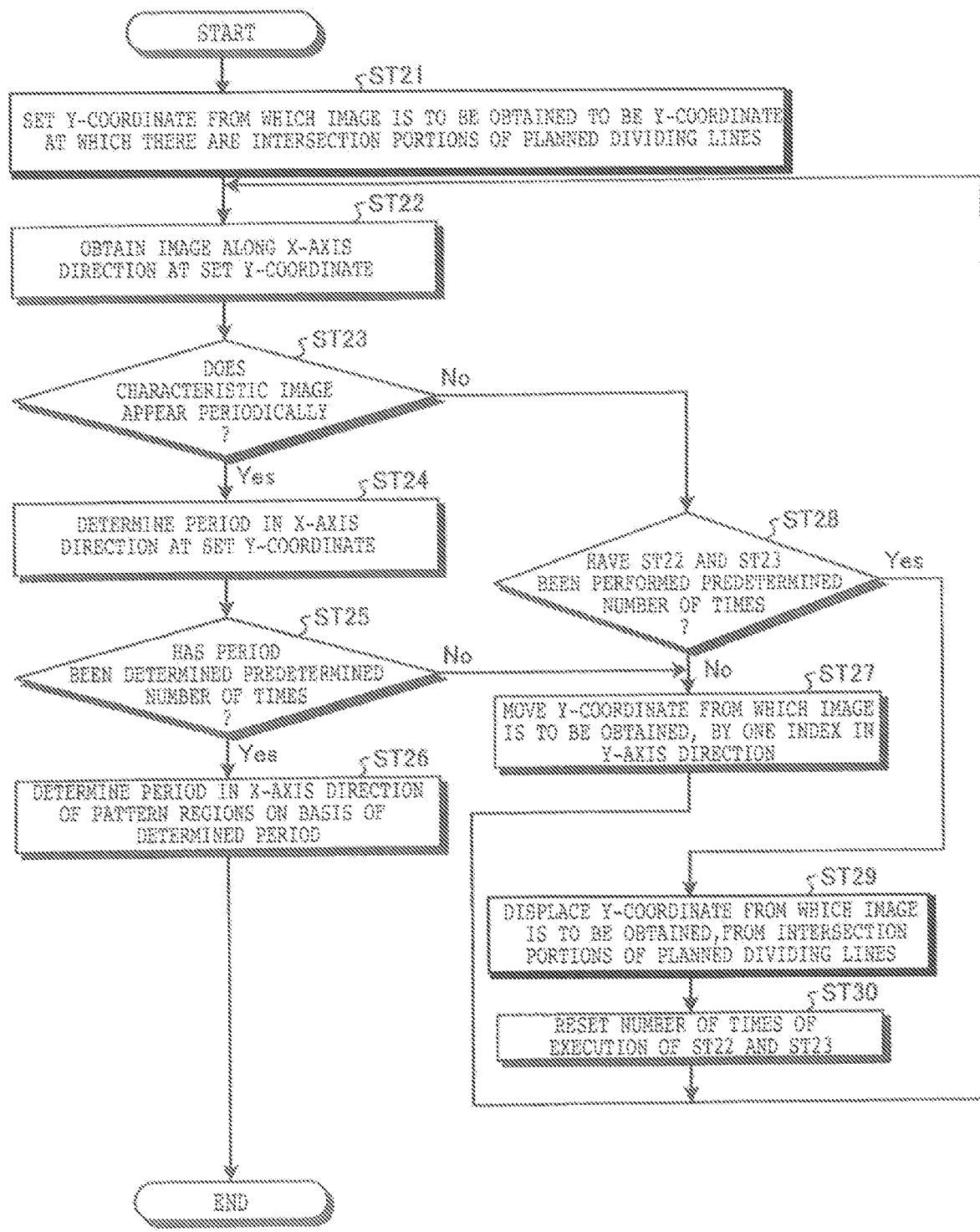
FIG. 4 is a flowchart illustrating an example of a detailed flow of a pattern region detecting step in the wafer processing method of FIG. 2.
Figure 5:
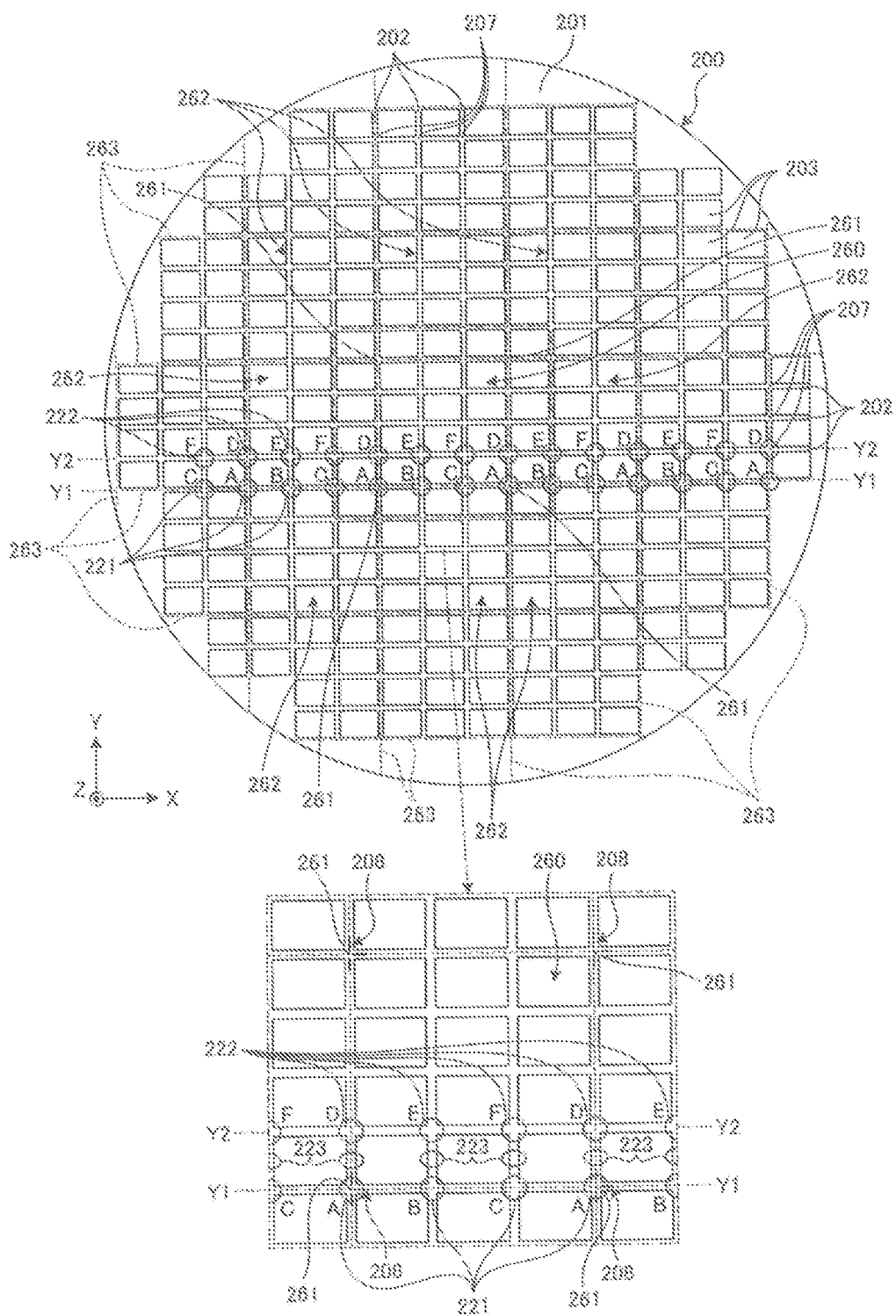
FIG. 5 is a plan view illustrating an example of the pattern region detecting step of FIG. 4.
Figure 6:
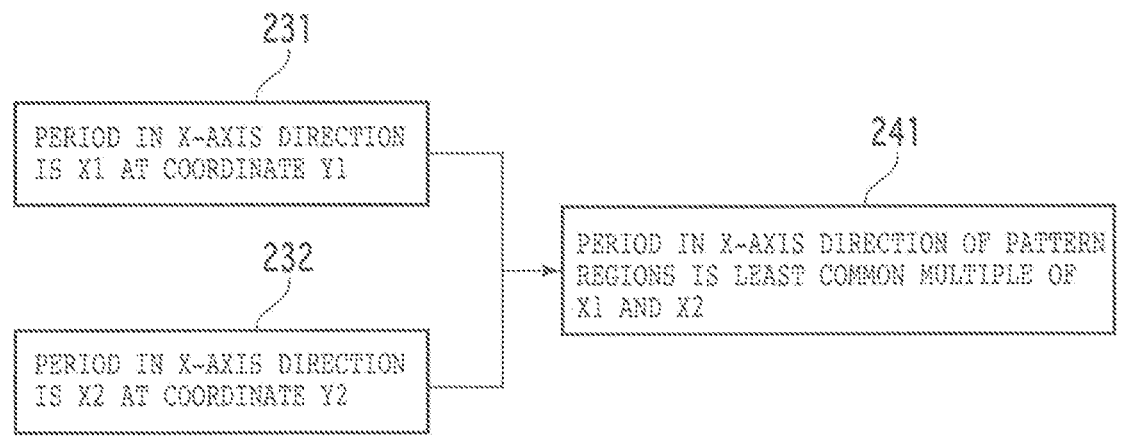
FIG. 6 is a block diagram illustrating an example of pattern region period determination processing in the pattern region detecting step of FIG. 4.
Figure 7:
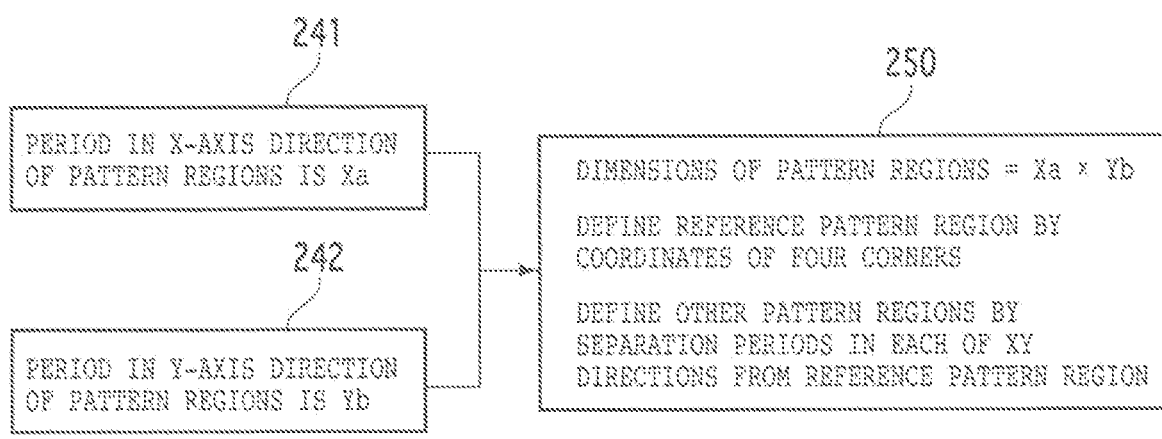
FIG. 7 is a block diagram illustrating an example of pattern region period determination processing in the pattern region detecting step of FIG. 4.

FIG. 4 is a flowchart illustrating an example of a detailed flow of the pattern region detecting step ST14 in the wafer processing method of FIG. 2. FIG. 5 is a diagram illustrating an example of the pattern region detecting step ST14 of FIG. 4. FIG. 6 is a diagram illustrating an example of pattern region period determination processing in the pattern region detecting step ST14 of FIG. 4. FIG. 7 is a diagram illustrating an example of pattern region period determination processing in the pattern region detecting step ST14 of FIG. 4. In the following, the pattern region detecting step ST14 in the wafer processing method according to the first embodiment will be described in detail with reference to FIG. 4, FIG. 5, FIG. 6, and FIG. 7.

In the pattern region detecting step ST14 performed for the X-axis direction corresponding to the first direction, first, the control unit 60 sets, as a Y-coordinate from which an image is to be obtained, a Y-coordinate at which a characteristic image appears relatively easily because of the presence of intersection portions 207 of planned dividing lines 202 (step ST21). In step ST21, in the example of the first embodiment depicted in FIG. 5, the control unit 60 sets a coordinate Y1 as a Y-coordinate from which an image is to be obtained.

In the pattern region detecting step ST14, after performing step ST21, the control unit 60 obtains an image of regions separated at intervals of one index along the X-axis direction at the Y-coordinate set in step ST21 (step ST22). Here, one index refers to a distance between planned dividing lines 202 adjacent to each other. One index along the X-axis direction and one index along the Y-axis direction are the same distance in the first embodiment. However, the present invention is not limited to this. One index along the X-axis direction and one index along the Y-axis direction may be different distances. In step ST22, the control unit 60 may obtain a macroscopic image, may obtain a microscopic image, or may obtain both the macroscopic image and the microscopic image. In step ST22, in the example of the first embodiment depicted in FIG. 5, the control unit 60 obtains respective images of all intersection portions 207, that is, a plurality of regions 221, at the coordinate Y1.

In the pattern region detecting step ST14, after performing step ST22, the control unit 60 determines whether or not a characteristic image periodically appears in the image obtained in step ST22 (step ST23). When the control unit 60 determines in step ST23 that a characteristic image periodically appears (YES in step ST23), the control unit 60 advances the processing to step ST24. In step ST24, the control unit 60 determines that there is a period in which a characteristic image appears along the X-axis direction at the Y-coordinate set in a previous step (step ST21 in this case).

In step ST23 in the example of the first embodiment depicted in FIG. 5, the control unit 60 determines that a characteristic image appears in a period of three indexes with [A, B, and C] as one set in the plurality of regions 221 at the coordinate Y1 (YES in step ST23). In subsequent step ST24, the control unit 60 determines that there is a period of three indexes along the X-axis direction at the coordinate Y1.

In the pattern region detecting step ST14, after performing step ST24, the control unit 60 determines whether or not the determination of the period along the X-axis direction in step ST24 has been made a predetermined number of times (step ST25). That is, in step ST25, the control unit 60 determines whether or not the period along the X-axis direction which period is determined in step ST24 is obtained at a predetermined number of different Y-coordinates.

When the control unit 60 determines in step ST25 that the determination of the period along the X-axis direction in step ST24 has been made the predetermined number of times (YES in step ST25), the control unit 60 determines a period in the X-axis direction of pattern regions on the basis of information regarding the period determined the predetermined number of times in step ST24 (step ST26).

In step ST25 in the example of the first embodiment depicted in FIG. 5, in a case where a setting is made such that it suffices to make the determination of the period along the X-axis direction once at one Y-coordinate, the control unit 60 determines that the determination of the period along the X-axis direction has been made the predetermined number of times (YES in step ST25), on the basis of the determination of the period of three indexes at the coordinate Y1. In subsequent step ST26, the control unit 60 determines that the period in the X-axis direction of the pattern regions is three indexes, on the basis of the information regarding the period of three indexes at the coordinate Y1.

When the control unit 60 determines in step ST25 that the determination of the period along the X-axis direction in step ST24 has not been made the predetermined number of times (NO in step ST25), on the other hand, the control unit 60 moves the Y-coordinate from which an image is to be obtained, by one index along the Y-axis direction (step ST27). The control unit 60 then returns the processing to step ST22. Incidentally, while the Y-coordinate from which an image is to be obtained is moved by one index in a +Y direction in step ST27 in the first embodiment, the present invention is not limited to this, but the Y-coordinate from which an image is to be obtained may be moved by one index in a −Y direction.

In step ST25, in another example of the first embodiment depicted in FIG. 5, in a case where a setting is made such that the determination of the period along the X-axis direction needs to be made a total of two times at two Y-coordinates, the control unit 60 determines that the determination of the period along the X-axis direction has not been made the predetermined number of times (NO in step ST25), on the basis of the determination of the period of three indexes only at the coordinate Y1. In subsequent step ST27, the control unit 60 sets the Y-coordinate from which an image is to be obtained, at a coordinate Y2, by moving the Y-coordinate from which an image is to be obtained, by one index along the Y-axis direction from the coordinate Y1, and performs the processing from step ST22 and subsequent steps again for the newly set coordinate Y2.

In this other example of the first embodiment depicted in FIG. 5, the control unit 60 obtains, in step ST22, respective images of all intersection portions 207, that is, a plurality of regions 222, at the coordinate Y2. Then, in subsequent step ST23, the control unit 60 determines that a characteristic image appears in a period of three indexes with [D, E, and F] as one set in the plurality of regions 222 at the coordinate Y2 (YES in step ST23). In subsequent step ST24, the control unit 60 determines that there is a period of three indexes along the X-axis direction at the coordinate Y2. Then, returning to step ST25 again, the control unit 60 determines that the determination of the period along the X-axis direction has been made twice, that is, the predetermined number of times, on the basis of the determination of the period of three indexes at the coordinate Y1 and the coordinate Y2 (YES in step ST25). In subsequent step ST26, the control unit 60 determines that a period in the X-axis direction of pattern regions is three indexes, on the basis of information regarding the period of three indexes at the coordinate Y1 and the coordinate Y2.

Thus, in a case where a setting is made such that the determination of the period along the X-axis direction needs to be made a plurality of times at a plurality of Y-coordinates in step ST25, period information in the X-axis direction of the pattern regions can be derived on the basis of period information along the X-axis direction at the plurality of Y-coordinates in step ST26. It is therefore made possible to derive the period information in the X-axis direction of the pattern regions more accurately.

In step ST26, more specifically, as depicted in FIG. 6, in a case where the control unit 60 performs information processing of deriving period information 241 in the X-axis direction of the pattern regions, on the basis of pieces of period information 231 and 232 along the X-axis direction at a plurality of Y-coordinates, the control unit 60 derives the period information 241 in the X-axis direction of the pattern regions on the basis of a least common multiple of a period X1 (expressed as a number of indexes) in the period information 231 and a period X2 (expressed as a number of indexes) in the period information 232. This enables the control unit 60 to derive the period information 241 in the X-axis direction of the pattern regions more accurately in step ST26.

Here, when the control unit 60 determines in step ST23 that no characteristic image periodically appears in the plurality of regions at the set Y-coordinate (NO in step ST23), the control unit 60 advances the processing to step ST28. In the pattern region detecting step ST14, the control unit 60 determines in step ST28 whether or not step ST22 and step ST23 have been performed a predetermined number of times (step ST28).

When the control unit 60 determines in step ST28 that step ST22 and step ST23 have not been performed the predetermined number of times (NO in step ST28), the control unit 60 moves the Y-coordinate from which an image is to be obtained, by one index along the Y-axis direction (step ST27). The control unit 60 then returns the processing to step ST22. Here, when step ST22 and step ST23 have not been performed the predetermined number of times, it is considered that there is still a sufficient possibility of a characteristic image appearing at other intersection portions 207, and therefore, image processing at other intersection portions 207 is prompted in the pattern region detecting step ST14 according to the first embodiment.

When the control unit 60 determines in step ST28 that step ST22 and step ST23 have been performed the predetermined number of times (YES in step ST28), the control unit 60 moves the Y-coordinate from which an image is to be obtained to a position displaced from the intersection portions 207 of the planned dividing lines 202 (step ST29). The control unit 60 then returns the processing to step ST22. Here, when step ST22 and step ST23 have been performed the predetermined number of times, the possibility of a characteristic image appearing at other intersection portions 207 is considered to be decreased sufficiently. Thus, prompted in the pattern region detecting step ST14 according to the first embodiment is image processing at, for example, a plurality of regions 223 depicted in FIG. 5 on planned dividing lines 202, the plurality of regions 223 being separated from the intersection portions 207.

Incidentally, while the pattern region detecting step ST14 in the first embodiment determines the period in the X-axis direction of the pattern regions by using an image of a partial region, the present invention is not limited to this, and images of the whole of the planned dividing lines 202 along the X-axis direction may be obtained continuously, and the period in the X-axis direction of the pattern regions may be determined on the basis of a characteristic image appearing periodically, by using a continuous image of the whole of the planned dividing lines 202.

In the pattern region detecting step ST14, when the control unit 60 completes all of the flow depicted in FIG. 4 in both the X-axis direction corresponding to the first direction of the planned dividing lines 202 and the Y-axis direction corresponding to the second direction of the planned dividing lines 202, the control unit 60 performs information processing of combining the period information 241 in the X-axis direction of the pattern regions which period information is derived by performing the flow depicted in FIG. 4 in the X-axis direction corresponding to the first direction with period information 242 in the Y-axis direction of the pattern regions which period information is derived by performing the flow depicted in FIG. 4 in the Y-axis direction corresponding to the second direction. Specifically, in the pattern region detecting step ST14, as depicted in FIG. 7, the control unit 60 detects a period and positional information 250 of the pattern regions in the planar direction (XY plane direction) on the basis of the period information 241 in the X-axis direction of the pattern regions and the period information 242 in the Y-axis direction of the pattern regions.

Here, the period and the positional information 250 of the pattern regions include information regarding the size of the pattern regions, information regarding a reference pattern region 260 defined by the XY coordinates of at least one corner, and information regarding other pattern regions 262. In the pattern region detecting step ST14, specifically, the control unit 60 determines that a period Xa (expressed as a number of indexes) in the X-axis direction of the pattern regions in the period information 241 and a period Yb (expressed as a number of indexes) in the Y-axis direction of the pattern regions in the period information 242 are dimensions of the pattern regions in the respective directions, sets a predetermined reference pattern region 260, defines the reference pattern region 260 by the XY coordinates of four corners 261, and defines the other pattern regions 262 by separation periods in the XY direction from the reference pattern region 260.

In an outer circumferential portion of the surface 201 of the wafer 200, the number of set planned dividing lines 202 is decreased, and therefore, pattern regions are often in a broken state. In view of this, the predetermined reference pattern region 260 set in the pattern region detecting step ST14 in the first embodiment is preferably set around the center of the surface 201 of the wafer 200. In this case, it is made possible to more reliably handle the reference pattern region 260 as a perfect pattern region without a break.

In the pattern region detecting step ST14, the control unit 60 detects pattern regions having a period of three indexes in the X-axis direction and a period of four indexes in the Y-axis direction, that is, 3×4 pattern regions, in the example of the first embodiment depicted in FIG. 5, defines the reference pattern region 260 on the basis of the XY coordinates of the four corners 261 in the vicinity of the center of the surface 201 of the wafer 200, and defines the other pattern regions 262 on the basis of separation periods in the XY direction from the reference pattern region 260. In addition, in the pattern region detecting step ST14, the control unit 60 in the present example can define pattern region boundary lines 263 between the reference pattern region 260 and the other pattern regions 262 and between the other pattern regions 262.

The evaluation region deploying step ST15 is performed after the evaluation region setting step ST13 and the pattern region detecting step ST14. The evaluation region deploying step ST15 is a step of deploying the evaluation region 210 set in the evaluation region setting step ST13 onto the surface 201 of the wafer 200 on the basis of the period and the positional information 250 of the pattern regions obtained in the pattern region detecting step ST14.

Figure 8:
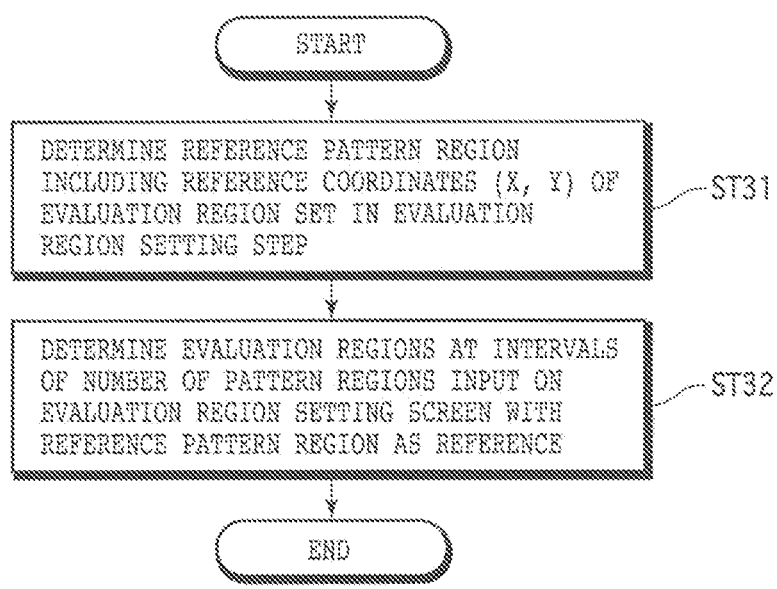
FIG. 8 is a flowchart illustrating an example of a detailed flow of an evaluation region deploying step in the wafer processing method of FIG. 2.
Figure 9:
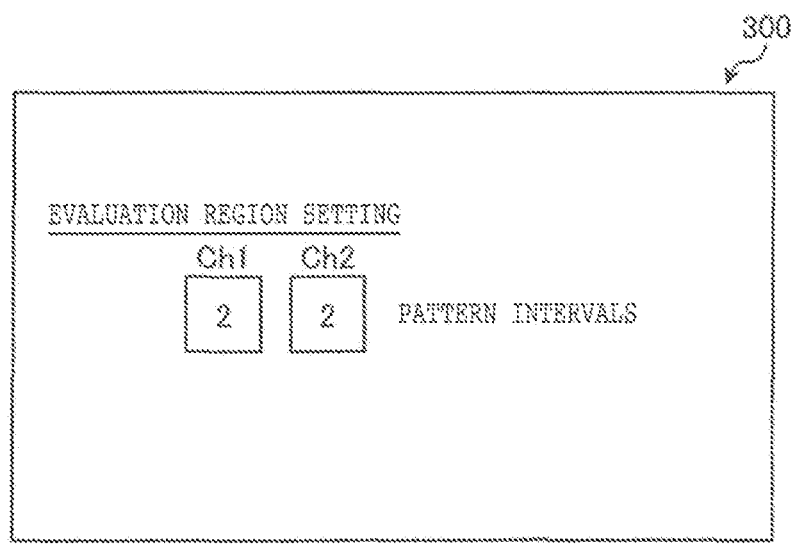
FIG. 9 is a diagram illustrating an example of a setting screen for the evaluation region deploying step in the wafer processing method of FIG. 2.
Figure 10:
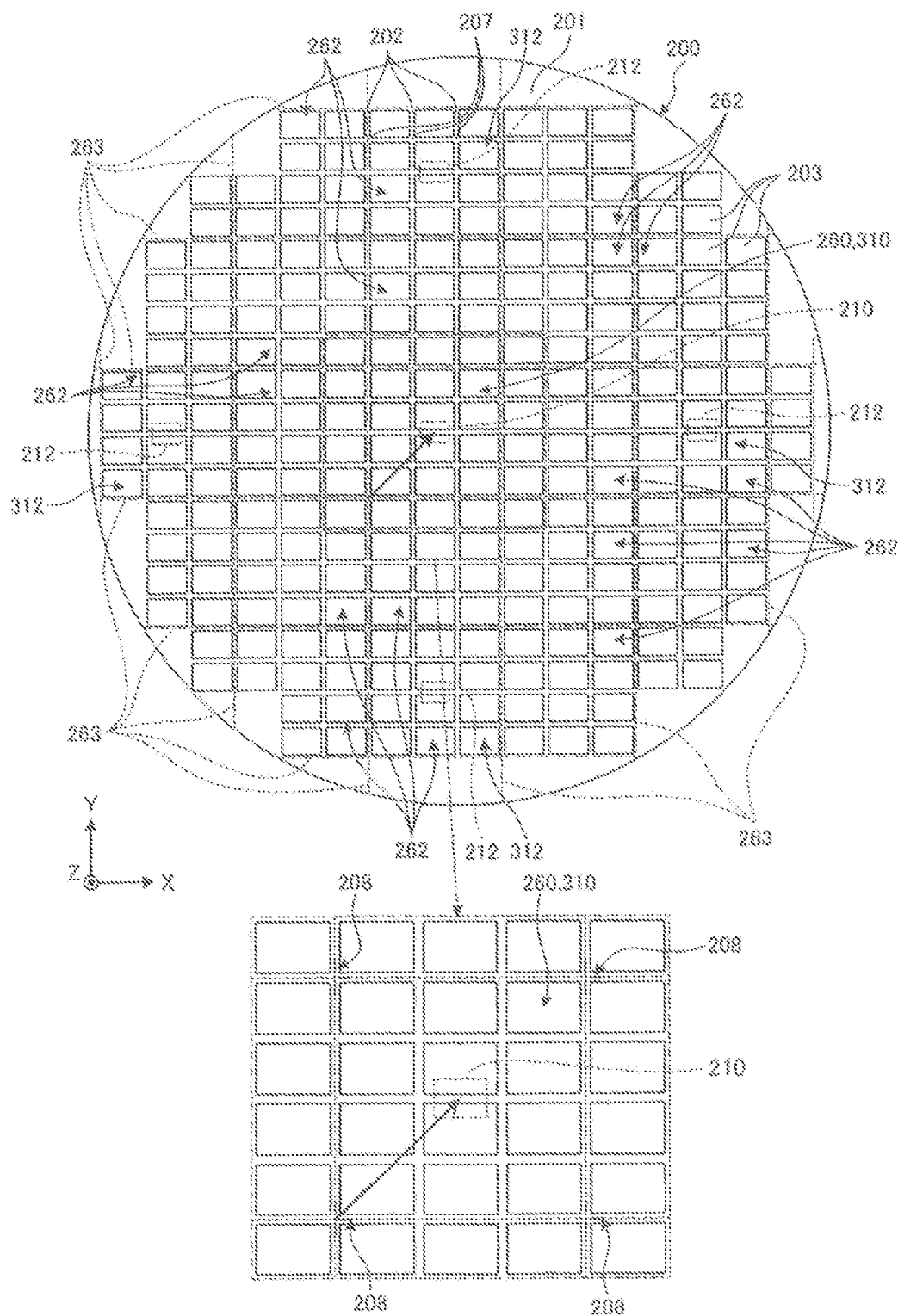
FIG. 10 is a plan view illustrating an example of the evaluation region deploying step in the wafer processing method of FIG. 2.

FIG. 8 is a flowchart illustrating an example of a detailed flow of the evaluation region deploying step ST15 in the wafer processing method of FIG. 2. FIG. 9 is a diagram illustrating an example of a setting screen 300 for the evaluation region deploying step ST15 in the wafer processing method of FIG. 2. FIG. 10 is a diagram illustrating an example of the evaluation region deploying step ST15 in the wafer processing method of FIG. 2. In the following, referring to FIG. 8, FIG. 9, and FIG. 10, detailed description will be made of the evaluation region deploying step ST15 in the wafer processing method according to the first embodiment.

In the evaluation region deploying step ST15, first, the control unit 60 determines a reference pattern region 310 including reference coordinates (X, Y) of the evaluation region 210 set in the evaluation region setting step ST13 (step ST31).

In the evaluation region deploying step ST15, as depicted in FIG. 10, the control unit 60 sets, at least after step ST31, an evaluation region 212 for checking the state of a processed groove at intervals of the number of pattern regions input on the setting screen 300 for the evaluation region 210, the setting screen 300 being depicted in FIG. 9, with the reference pattern region 310 determined in step ST31 as a reference (step ST32).

The setting screen 300 for the evaluation region 210 is a form of a screen displayed on the display unit 61 by the control unit 60. As depicted in FIG. 9, the setting screen 300 is a screen for receiving input from the operator as to the number of pattern regions at intervals of which the evaluation region 210 is to be deployed for Ch1 and the number of pattern regions at intervals of which the evaluation region 210 is to be deployed for Ch2. On the setting screen 300 of FIG. 9, Ch1 indicates a numerical value input item for the X-axis direction corresponding to the first direction, and Ch2 indicates a numerical value input item for the Y-axis direction corresponding to the second direction. In the example of the first embodiment depicted in FIG. 9, an input representing to the effect that the evaluation region 210 is to be deployed at intervals of two pattern regions in the X-axis direction corresponding to the first direction is performed by inputting 2 on Ch1, and an input representing to the effect that the evaluation region 210 is to be deployed at intervals of two pattern regions in the Y-axis direction corresponding to the second direction is performed by inputting 2 on Ch2.

In step ST32, because the input representing to the effect that the evaluation region 210 is to be deployed at intervals of two pattern regions in the X-axis direction and the Y-axis direction is performed in the example of the first embodiment depicted in FIG. 9 and FIG. 10, the control unit 60 sets a total of four evaluation regions 212 arranged in positions at intervals of two pattern regions with the reference pattern region 310 as a starting point.

Thus, in the evaluation region deploying step ST15, a plurality of evaluation regions 212 can be set at the same time by deploying the evaluation region 210 into a plurality of pattern regions 312 under a condition input with the reference pattern region 310 as a starting point.

Figure 11:
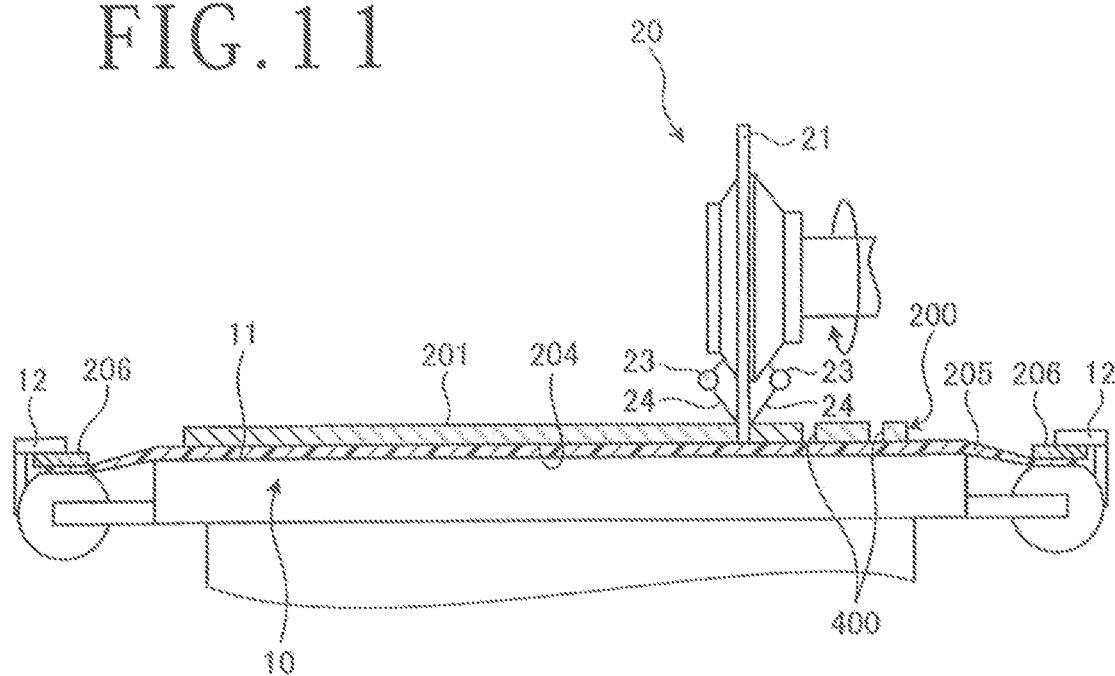
FIG. 11 is a sectional view illustrating an example of a processing step in the wafer processing method of FIG. 2.

FIG. 11 is a diagram illustrating an example of the processing step ST16 in the wafer processing method of FIG. 2. The processing step ST16 is performed after the evaluation region deploying step ST15. The processing step ST16 is a step in which the processing unit 20 processes the wafer 200. In the processing step ST16 in the first embodiment, specifically, as depicted in FIG. 11, the control unit 60 rotates the cutting blade 21 fitted to the processing unit 20 about an axis by the processing unit 20 while supplying a cutting liquid 24 from cutting liquid supply units 23 of the processing unit 20 to the surface 201 of the wafer 200 in a holding state formed in the holding step ST11 in which holding state the surface 201 side of the wafer 200 is exposed and held on the holding table 10. In the processing step ST16, then, the control unit 60 performs cutting processing from the surface 201 side of the wafer 200 along the planned dividing lines 202 by processing-feeding, indexing-feeding, and cutting-feeding the holding table 10 or the cutting blade 21 of the processing unit 20 by the X-axis moving unit 71, the Y-axis moving unit 72, and the Z-axis moving units 73 in a state in which the control unit 60 rotates the cutting blade 21 about the axis. In the processing step ST16, cut grooves 400 are formed along the planned dividing lines 202 on the surface 201 side of the wafer 200 by such cutting processing.

Incidentally, as in the pattern region detecting step ST14, the control unit 60 performs the processing step ST16 in both the X-axis direction corresponding to the first direction of the planned dividing lines 202 and the Y-axis direction corresponding to the second direction of the planned dividing lines 202, thereby forming cut grooves 400 along the planned dividing lines 202 along the X-axis direction and forming cut grooves 400 along the planned dividing lines 202 along the Y-axis direction.

The processed groove evaluating step ST17 is performed after the processing step ST16. The processed groove evaluating step ST17 is a step in which the control unit 60 images cut grooves 400 by imaging evaluation regions 210 and 212 in at least two or more pattern regions by the imaging unit 30 and determines the quality of the cut grooves 400 by the inspecting section 40. That is, in the processed groove evaluating step ST17, the control unit 60 images the cut grooves 400 by imaging the evaluation regions 210 and 212 by the imaging unit 30, the evaluation regions 210 and 212 being the evaluation region 210 set in advance as well as at least one or more evaluation regions 212 set by deploying the evaluation region 210 in the evaluation region deploying step ST15, and performs what is generally called a kerf check on an image of the imaged cut grooves 400 by the inspecting section 40. Incidentally, in the processed groove evaluating step ST17 in the first embodiment, the control unit 60 performs what is generally called the kerf check on the evaluation region 210 and all of the evaluation regions 212.

Incidentally, as in the pattern region detecting step ST14 and the processing step ST16, the control unit 60 performs the processed groove evaluating step ST17 in both the X-axis direction corresponding to the first direction of the planned dividing lines 202 and the Y-axis direction corresponding to the second direction of the planned dividing lines 202. The control unit 60 thereby images cut grooves 400 along the X-axis direction to determine the quality of the cut grooves 400 and images cut grooves 400 along the Y-axis direction to determine the quality of the cut grooves 400.

In the processed groove evaluating step ST17 in the first embodiment, the control unit 60 can, for example, set, as inspection items of what is generally called the kerf check, items as to whether or not the position of an edge of a cut groove 400 is displaced by more than a predetermined threshold value, whether or not a width 401 of the cut groove 400 is too small, whether or not a chipping size is larger than a set threshold value, and the like. Incidentally, the control unit 60 can display an unillustrated predetermined dedicated setting screen for these settings on the display unit 61 and thereby receive setting inputs through the setting screen.

Figure 12:
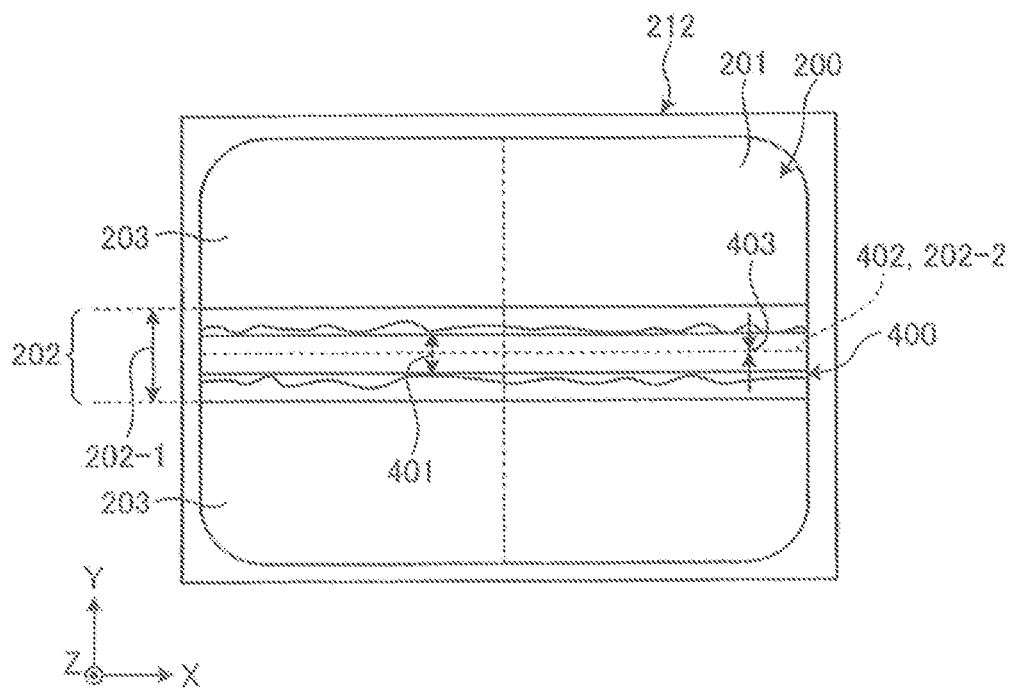
FIG. 12 is a front view illustrating an example of a processed groove evaluating step in the wafer processing method of FIG. 2.

FIG. 12 is a diagram illustrating an example of the processed groove evaluating step ST17 in the wafer processing method of FIG. 2. An example of the processed groove evaluating step ST17 in the wafer processing method according to the first embodiment will be described by illustrating an inspection screen in one evaluation region 212. As depicted in FIG. 12, the inspection screen in the one evaluation region 212 illustrates a state in which the cut groove 400 is included within a width 202-1 of the planned dividing line 202, a center line 402 of the cut groove 400 substantially coincides with a center line 202-2 of the planned dividing line 202, that is, an offset 403 in a width direction of the center line 402 with respect to the center line 202-2 is substantially zero, the position of an edge of the cut groove 400 is not displaced by more than a threshold value, the width 401 of the cut groove 400 is not too small, and no chipping has occurred so that the chipping size is naturally not larger than a threshold value. Thus, in the processed groove evaluating step ST17, the control unit 60 determines by the inspecting section 40 that, in the evaluation region 212, the cut groove 400 passes, that is, is good in all of the set inspection items. In the processed groove evaluating step ST17, the control unit 60 can give a notification to the operator by displaying this "good" determination on the display unit 61, for example.

The wafer processing method according to the first embodiment has a configuration as described above. Thus, the evaluation region setting step ST13 detects a position in which no metallic pattern 208 is formed on planned dividing lines 202 and sets the position as an evaluation region 210 for evaluating the quality of a cut groove 400 as a processed groove, and the pattern region detecting step ST14 detects a period and positional information in which a substantially identical image appears in an imaged image and detects a pattern region corresponding to one reticle. Therefore, the wafer processing method according to the first embodiment has an action and an effect of being able to deploy the evaluation region 210 set in a region in which no metallic pattern 208 is formed in the evaluation region setting step ST13 onto the surface 201 of the wafer 200 in the evaluation region deploying step ST15, on the basis of the period and the positional information 250 of the pattern region detected in the pattern region detecting step ST14, and thereby set new evaluation regions 212 in regions in which a metallic pattern 208 is similarly not formed, without forcing new registration work on the operator. Specifically, the wafer processing method according to the first embodiment has an action and an effect in that the evaluation regions 210 and 212 in different pattern regions can be automatically set in regions in which no metallic pattern 208 is formed when the operator sets only one evaluation region 210 in a region in which no metallic pattern 208 is formed. That is, the wafer processing method according to the first embodiment has an action and an effect of being able to reduce the trouble of the work of registering positions in which there is no metallic pattern 208 such as a TEG to perform what is generally called the kerf check for evaluating the quality of cut grooves 400. In addition, the wafer processing method according to the first embodiment can thereby perform the kerf check while avoiding metallic patterns 208 such as TEGs more reliably than in the past and can therefore stabilize the kerf check.

In the wafer processing method according to the first embodiment, a plurality of planned dividing lines 202 are formed in the first direction (X-axis direction) and the second direction (Y-axis direction) intersecting the first direction (X-axis direction), and the pattern region detecting step ST14 is performed in both the first direction (X-axis direction) and the second direction (Y-axis direction). The wafer processing method according to the first embodiment therefore detects the period of pattern regions in both the first direction (X-axis direction) and the second direction (Y-axis direction), and thus has an action and an effect of being able to deploy the evaluation region 210 into evaluation regions 212 in both the first direction (X-axis direction) and the second direction (Y-axis direction) in the evaluation region deploying step ST15.

[Modifications]

Figure 13:
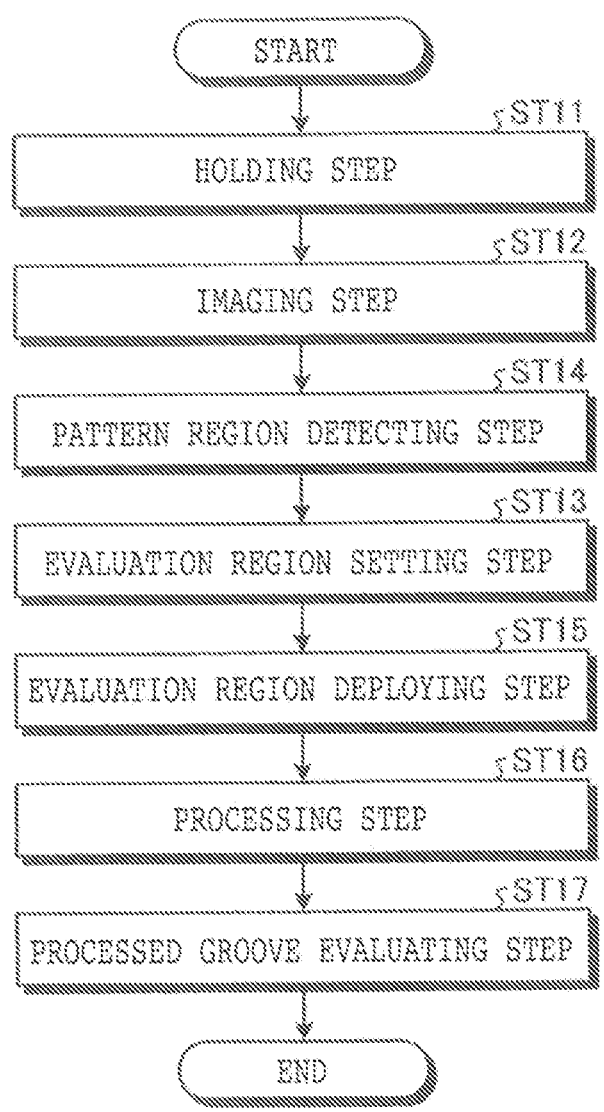
FIG. 13 is a flowchart illustrating an example of a flow of a wafer processing method according to a modification of the first embodiment.

A wafer processing method according to a modification of the first embodiment of the present invention will be described with reference to drawings. FIG. 13 is a flowchart illustrating an example of a flow of the wafer processing method according to the modification of the first embodiment. In FIG. 13, same parts as in the first embodiment are identified by the same reference numerals, and description thereof will be omitted.

The wafer processing method according to the modification of the first embodiment is obtained by interchanging the execution order of the evaluation region setting step ST13 and the pattern region detecting step ST14 in the wafer processing method according to the first embodiment. The other configuration of the wafer processing method according to the modification of the first embodiment is the same as that of the wafer processing method according to the first embodiment. In the wafer processing method according to the modification of the first embodiment, after the alignment and the imaging step ST12, the control unit 60 performs the pattern region detecting step ST14, and in the evaluation region setting step ST13 performed after the pattern region detecting step ST14, the control unit 60 sets a part of a region in which no metallic pattern 208 is formed as in the first embodiment in a pattern region corresponding to one period, as an evaluation region 210 for evaluating the quality of a cut groove 400 as a processed groove. In addition, in the wafer processing method according to the modification of the first embodiment, in a case where a plurality of evaluation regions 210 are to be set, the plurality of evaluation regions 210 may be set from one pattern region, or may be set from two or more pattern regions.

The wafer processing method according to the modification of the first embodiment can be processed by receiving also an input of a reference pattern region 310 as the evaluation region 210 is input in the evaluation region setting step ST13. That is, in the wafer processing method according to the modification of the first embodiment, the evaluation region 210 whose setting input is received in the evaluation region setting step ST13 can be processed as a setting input of the evaluation region 210 in the reference pattern region 310.

The wafer processing method according to the modification of the first embodiment has a configuration as described above. Thus, because the wafer processing method according to the modification of the first embodiment is obtained by interchanging the execution order of the evaluation region setting step ST13 and the pattern region detecting step ST14 in the wafer processing method according to the first embodiment, the wafer processing method according to the modification of the first embodiment has an action and an effect similar to those of the wafer processing method according to the first embodiment.

Second Embodiment

Figure 14:
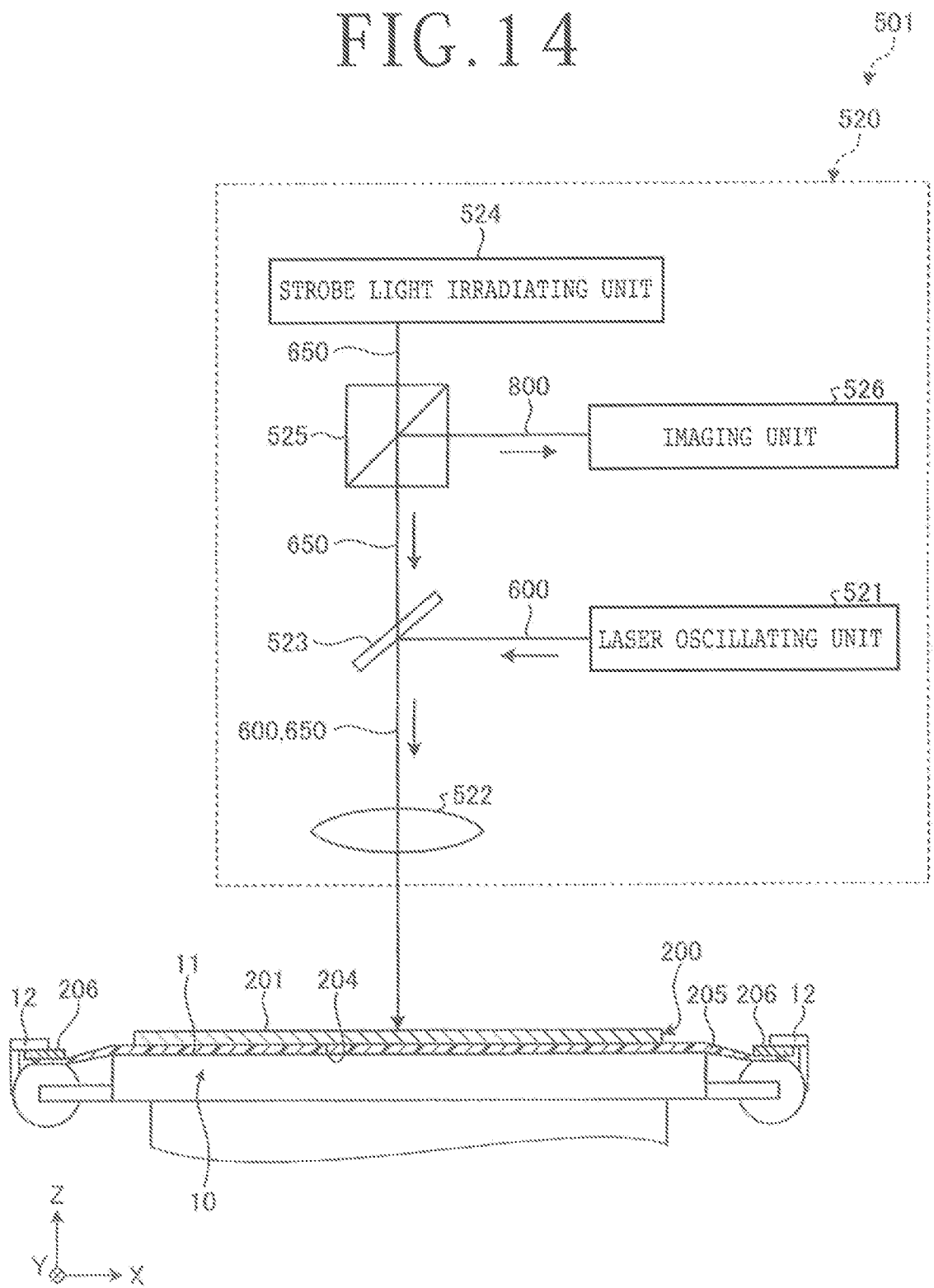
FIG. 14 is a block diagram illustrating an example of a configuration of principal parts of a laser processing apparatus that performs a wafer processing method according to a second embodiment.
Figure 15:
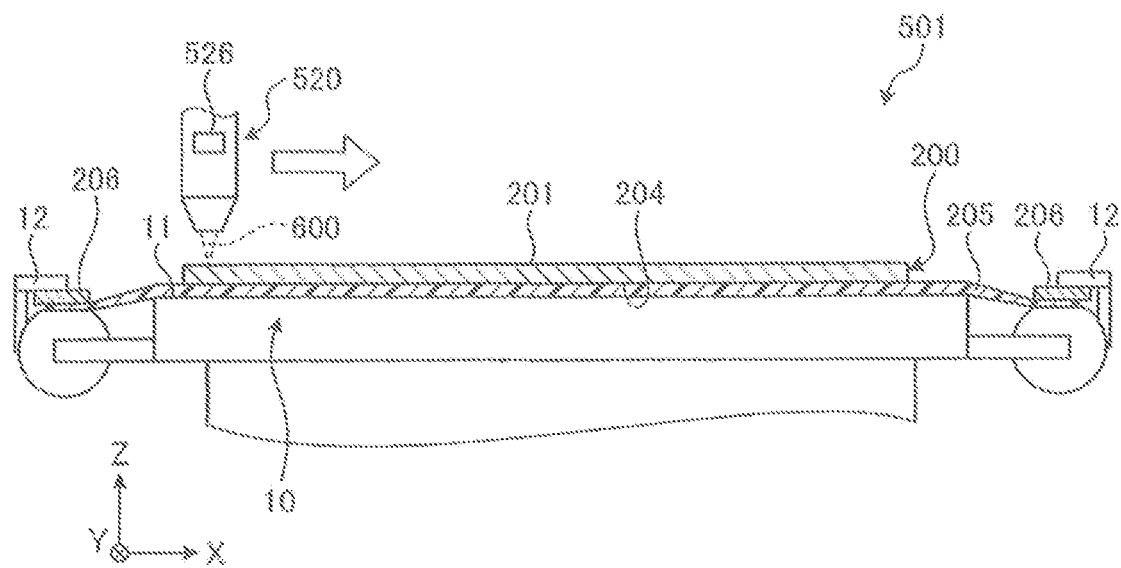
FIG. 15 is a sectional view illustrating an example of a processing step in the wafer processing method according to the second embodiment.
Figure 16:
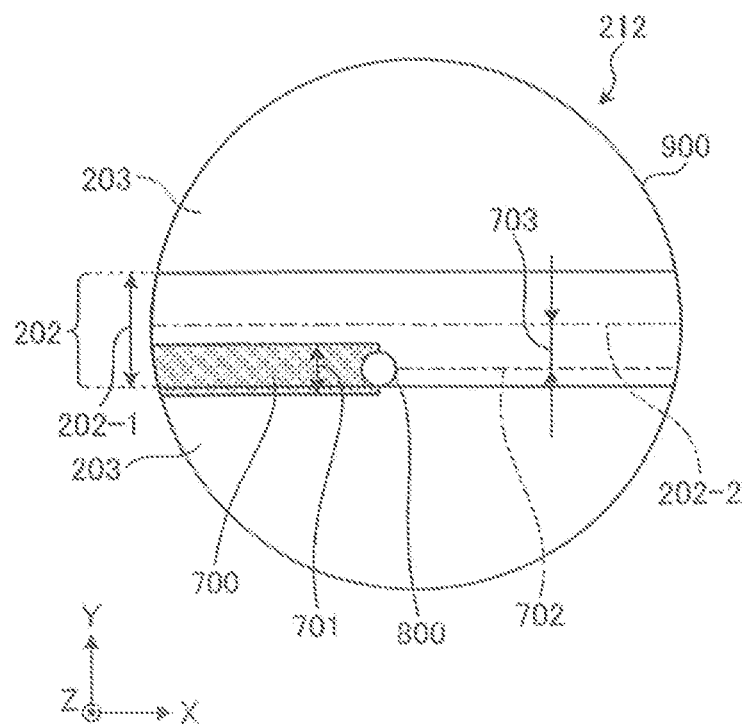
FIG. 16 is a diagram illustrating an example of a processed groove evaluating step in the wafer processing method according to the second embodiment.

A wafer processing method according to a second embodiment of the present invention will be described with reference to drawings. FIG. 14 is a block diagram illustrating an example of a configuration of principal parts of a laser processing apparatus 501 that performs the wafer processing method according to the second embodiment. FIG. 15 is a diagram illustrating an example of a processing step ST16 in the wafer processing method according to the second embodiment. FIG. 16 is a diagram illustrating an example of a processed groove evaluating step ST17 in the wafer processing method according to the second embodiment. In FIG. 14, FIG. 15, and FIG. 16, same parts as in the first embodiment are identified by the same reference numerals, and description thereof will be omitted.

As depicted in FIG. 14, the laser processing apparatus 501 is obtained by changing the processing unit 20 and the imaging unit 30 in the processing apparatus 1 to a laser processing unit 520 and accordingly changing the functions of the inspecting section 40, the recording section 50, and the control unit 60 to laser processing and kerf navigation specifications. The other configuration of the laser processing apparatus 501 is similar to that of the processing apparatus 1. A workpiece of the laser processing apparatus 501 is the wafer 200, as with the workpiece of the processing apparatus 1.

As depicted in FIG. 14, FIG. 15, and FIG. 16, the laser processing apparatus 501 is a laser processing apparatus that laser-processes the wafer 200 by irradiating the wafer 200 with a laser (laser beam) 600, carries out what is generally called kerf navigation, which images a predetermined region of the wafer 200 during the laser processing and emitted light 800 generated by the laser irradiation, and determines the quality of processing conditions.

The laser processing unit 520 forms a laser-processed groove 700 (see FIG. 16) by processing along a planned dividing line 202 the wafer 200 held on the holding table 10. The irradiation position of the laser 600 of the laser processing unit 520 is disposed so as to be movable in the Y-axis direction by the Y-axis moving unit 72 and movable in the Z-axis direction by the Z-axis moving units 73 with respect to the wafer 200 held on the holding table 10. On the other hand, the holding table 10 is disposed so as to be movable in the X-axis direction by the X-axis moving unit 71 with respect to the irradiation position of the laser 600 of the laser processing unit 520.

As depicted in FIG. 14, the laser processing unit 520 includes a laser oscillating unit 521, a condenser 522, a dichroic mirror 523, a strobe light irradiating unit 524, a beam splitter 525, and an imaging unit 526.

The laser oscillating unit 521 includes a laser oscillator and a repetition frequency setting unit that are not depicted. The laser oscillator of the laser oscillating unit 521 is an apparatus that oscillates the laser 600 having a predetermined wavelength. Used as a suitable laser oscillator in the second embodiment is a laser oscillator that oscillates a laser having a wavelength of approximately 1 μm by pumping a crystal such as yttrium aluminum garnet (YAG) doped with neodymium (Nd) ions or the like by a laser diode (LD). The repetition frequency setting unit of the laser oscillating unit 521 is a functional unit that sets the repetition frequency of the laser oscillated by the oscillator. Used as a suitable repetition frequency setting unit in the second embodiment is a repetition frequency setting unit that sets the repetition frequency twofold and, on the basis of the above-described laser having the wavelength of approximately 1 μm, oscillates the laser 600 having a wavelength of approximately 514 nm, which represents a doubled wave of the laser having the wavelength of approximately 1 μm. The laser oscillating unit 521 in the second embodiment is controlled by the control unit 60 and oscillates the laser 600 as a pulsed laser beam having a repetition frequency of 50 to 200 kHz both inclusive, an average power of 0.1 to 2.0 W both inclusive, and a pulse width of 20 ps or less.

The condenser 522 is an optical apparatus that condenses the laser 600 oscillated from the laser oscillating unit 521 and applies the laser 600 to the wafer 200 held on the holding table 10. A condensing lens, for example, is suitably used as the condenser 522.

The dichroic mirror 523 is an optical apparatus that reflects light of frequencies at and in the vicinity of that of the laser 600 oscillated from the laser oscillating unit 521 and transmits light of other frequencies. The dichroic mirror 523 reflects the laser 600 oscillated from the laser oscillating unit 521 and guides the laser 600 to the condenser 522. The dichroic mirror 523 transmits strobe light 650 emitted by the strobe light irradiating unit 524 and guides the strobe light 650 to the condenser 522. The dichroic mirror 523 transmits emitted light 800 from the wafer 200 held on the holding table 10 and guides the emitted light 800 to the beam splitter 525.

The strobe light irradiating unit 524 includes an unillustrated strobe light source and an unillustrated optical system. The strobe light source of the strobe light irradiating unit 524 is an apparatus that emits predetermined strobe light 650. In the second embodiment, a xenon flash lamp that emits predetermined white light is used as a suitable strobe light source. The optical system of the strobe light irradiating unit 524 guides the strobe light 650 emitted by the strobe light source to the beam splitter 525. An optical system in which an optical diaphragm, a condensing lens, and a direction changing mirror are arranged in order from the strobe light source side is used as a suitable optical system.

The beam splitter 525 transmits the strobe light 650 emitted by the strobe light irradiating unit 524 and guides the strobe light 650 to the dichroic mirror 523. The beam splitter 525 reflects the emitted light 800 of laser plasma generated on the surface 201 side of the wafer 200 by the application of the laser 600 and guides the emitted light 800 to the imaging unit 526.

The imaging unit 526 includes an unillustrated group lens and an unillustrated imaging element. The group lens of the imaging unit 526 is an optical system formed by arranging an aberration correcting lens and an image forming lens in this order. The imaging element of the imaging unit 526 is an element that images an image captured by the group lens. An imaging element similar to the imaging element used in the imaging unit 30 according to the first embodiment is used as a suitable imaging element.

As with the imaging unit 30 according to the first embodiment, the imaging unit 526 photographs the surface 201 of the wafer 200 held on the holding surface 11 of the holding table 10 and images a planned dividing line 202 of the wafer 200 yet to be subjected to laser processing which wafer is held on the holding table 10 and a laser-processed groove 700 as a processing trace in the wafer 200 subjected to the laser processing. An imaging region of the imaging unit 526 moves integrally with the irradiation position of the laser 600 of the laser processing unit 520.

In a case where the imaging unit 526 performs imaging while the laser 600 oscillated by the laser oscillating unit 521 and the strobe light 650 emitted by the strobe light irradiating unit 524 are applied, the imaging unit 526 images the emitted light 800 of laser plasma generated by the application of the laser 600 in addition to the surface 201 of the wafer 200. The imaging unit 526 obtains an image for carrying out what is generally called kerf navigation, which determines the quality of the laser processing, by imaging the surface 201 of the wafer 200 and the emitted light 800 of laser plasma in a predetermined region during the laser processing, and outputs the obtained image to the control unit 60.

The inspecting section 40 is a functional section that detects a laser-processed groove 700 as a processing trace formed by the laser processing unit 520 and the emitted light 800 of laser plasma generated during the laser processing from the image obtained by photographing a planned dividing line 202 during the laser processing and inspects the quality of processing conditions of the laser processing in predetermined inspection items.

The wafer processing method according to the second embodiment is obtained by changing the processing step ST16 and the processed groove evaluating step ST17 in the wafer processing method according to the first embodiment.

As depicted in FIG. 15, in the processing step ST16 in the wafer processing method according to the second embodiment, the control unit 60 applies the laser 600 to the surface 201 of the wafer 200 by the laser processing unit 520 in a holding state similar to that when the processing step ST16 according to the first embodiment is performed. In the processing step ST16 according to the second embodiment, then, the control unit 60 performs the laser processing from the surface 201 side of the wafer 200 along the planned dividing lines 202 by processing-feeding, indexing-feeding, and cutting-feeding the holding table 10 or the irradiation position of the laser 600 of the laser processing unit 520 by the X-axis moving unit 71, the Y-axis moving unit 72, and the Z-axis moving units 73 in a state in which the control unit 60 applies the laser 600. In the processing step ST16, laser-processed grooves 700 are formed on the surface 201 side of the wafer 200 along the planned dividing lines 202 by such laser processing.

The processed groove evaluating step ST17 in the wafer processing method according to the second embodiment is performed in parallel with the processing step ST16, that is, performed during the laser processing. The processed groove evaluating step ST17 according to the second embodiment is a step of imaging evaluation regions 210 and 212 and the emitted light 800 of laser plasma generated by the application of the laser 600, during the processing of the evaluation regions 210 and 212, and determining the quality of processing conditions.

An example of the processed groove evaluating step ST17 in the wafer processing method according to the second embodiment will be described by illustrating an inspection screen 900 in one evaluation region 212 as in the first embodiment. As depicted in FIG. 16, the inspection screen 900 is obtained by imaging a planned dividing line 202 in the evaluation region 212, a formed laser-processed groove 700, and the emitted light 800 of laser plasma. The emitted light 800 of laser plasma is imaged at a front end part of the laser-processed groove 700.

As depicted in FIG. 16, the inspection screen 900 indicates a state in which the laser-processed groove 700 is not included within the width 202-1 of the planned dividing line 202, a center line 702 of the laser-processed groove 700 has a large offset 703 in a width direction with respect to the center line 202-2 of the planned dividing line 202, and the position of an edge of the laser-processed groove 700 is displaced by more than a threshold value. In addition, the inspection screen 900 indicates a state in which a width 701 of the laser-processed groove 700 is not too small and no chipping has occurred so that the chipping size is naturally not larger than a threshold value. Thus, in the processed groove evaluating step ST17, the control unit 60 determines by the inspecting section 40 that, in the evaluation region 212, the laser-processed groove 700 does not pass, that is, fails in a part of the set inspection items.

The wafer processing method according to the second embodiment has a configuration as described above and therefore performs what is generally called kerf navigation in place of what is generally called the kerf check in the wafer processing method according to the first embodiment.

However, the wafer processing method according to the second embodiment has the evaluation region setting step ST13 and the pattern region detecting step ST14 similar to those of the wafer processing method according to the first embodiment, and therefore, has actions and effects similar to those of the wafer processing method according to the first embodiment. That is, the wafer processing method according to the second embodiment has an action and an effect of being able to reduce the trouble of the work of registering positions in which there is no metallic pattern 208 such as a TEG to perform what is generally called the kerf navigation for evaluating the quality of the laser-processed groove 700. In addition, the wafer processing method according to the second embodiment can thereby perform the kerf navigation while avoiding metallic patterns 208 such as TEGs more reliably than in the past and can therefore stabilize the kerf navigation.

As in the modification applicable in the wafer processing method according to the first embodiment, the wafer processing method according to the second embodiment is susceptible of a modification in which the execution order of the evaluation region setting step ST13 and the pattern region detecting step ST14 is interchanged. In a wafer processing method according to the modification of the present second embodiment, the pattern region detecting step ST14 is performed, and in the evaluation region setting step ST13 performed after the pattern region detecting step ST14, a part of a region in which no metallic pattern 208 is formed as in the second embodiment in a pattern region is set as an evaluation region 210 for evaluating the quality of a laser-processed groove 700 as a processed groove.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having a plurality of identical pattern regions periodically formed on a top surface, the identical pattern regions each including a plurality of planned dividing lines intersecting each other and device regions demarcated by the plurality of planned dividing lines, wherein a plurality of metallic patterns are formed on the planned dividing lines, the method comprising:
    a holding step of holding an undersurface side of the wafer on a holding table;
    an imaging step of imaging a plurality of positions on the top surface of the wafer while moving the holding table and an imaging unit relative to each other;
    a pattern region detecting step of detecting a period and positional information in which a substantially identical image appears in an imaged image and detecting the pattern region corresponding to one period;
    an evaluation region setting step of detecting positions in which the metallic patterns are formed on the dividing lines and of detecting a position in which no metallic pattern is formed on the planned dividing lines and setting the position with no metallic pattern as an evaluation region for evaluating quality of a processed groove;
    an evaluation region deploying step of recording a position of the evaluation region in the pattern region and deploying the evaluation region at similar positions in different pattern regions;
    a processing step of processing the wafer; and
    a processed groove evaluating step of imaging processed grooves by imaging the evaluation region in at least two or more of the pattern regions, and determining the quality of the processed grooves.

2. The wafer processing method according to claim 1, wherein:
    the plurality of planned dividing lines are formed in a first direction and a second direction intersecting the first direction, and
    the pattern region detecting step is performed in both the first direction and the second direction.

3. The wafer processing method according to claim 1, wherein each of the plurality of metallic patterns comprises a test element group.

4. A method of processing a wafer having a plurality of identical pattern regions periodically formed on a top surface, the identical pattern regions each including a plurality of planned dividing lines intersecting each other and device regions demarcated by the plurality of planned dividing lines, the method comprising:
    a holding step of holding an undersurface side of the wafer on a holding table;
    an imaging step of imaging a plurality of positions on the top surface of the wafer while moving the holding table and an imaging unit relative to each other;
    a pattern region detecting step of detecting a period and positional information in which a substantially identical image appears in an imaged image and detecting the pattern region corresponding to one period;
    an evaluation region setting step of detecting a position in which no metallic pattern is formed on the planned dividing lines and setting the position as an evaluation region for evaluating quality of a processed groove;
    an evaluation region deploying step of recording a position of the evaluation region in the pattern region and deploying the evaluation region at similar positions in different pattern regions;
    a processing step of processing the wafer by irradiating the wafer with a laser beam; and
    a processed groove evaluating step of imaging the evaluation region and emitted light generated by application of the laser beam during processing of the evaluation region and determining quality of processing conditions.

* * * * *